(12) United States Patent
Takahashi et al.

(10) Patent No.: US 12,360,573 B2
(45) Date of Patent: Jul. 15, 2025

(54) FOLDABLE ELECTRONIC APPARATUS

(71) Applicant: LENOVO (SINGAPORE) PTE. LTD., Singapore (SG)

(72) Inventors: Daisuke Takahashi, Yokohama (JP); Tabito Miyamoto, Yokohama (JP); Hiroaki Kinoshita, Yokohama (JP); Takayuki Morino, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 200 days.

(21) Appl. No.: 18/068,472

(22) Filed: Dec. 19, 2022

(65) Prior Publication Data
US 2023/0266803 A1 Aug. 24, 2023

(30) Foreign Application Priority Data
Feb. 18, 2022 (JP) .................... 2022-023812

(51) Int. Cl.
*G06F 1/16* (2006.01)
*G06F 1/20* (2006.01)
*H05K 7/20* (2006.01)

(52) U.S. Cl.
CPC .......... *G06F 1/1681* (2013.01); *G06F 1/1616* (2013.01); *G06F 1/1652* (2013.01); *G06F 1/203* (2013.01); *H05K 7/20481* (2013.01); *G06F 1/1683* (2013.01); *G06F 2200/203* (2013.01)

(58) Field of Classification Search
None
See application file for complete search history.

(56) References Cited

U.S. PATENT DOCUMENTS

| | | | |
|---|---|---|---|
| 11,416,040 B1 * | 8/2022 | Cavallaro | G06F 1/203 |
| 12,158,779 B2 * | 12/2024 | Ohyama | H04M 1/0216 |
| 2015/0241925 A1 * | 8/2015 | Seo | G06F 1/1652 361/679.27 |
| 2018/0329464 A1 * | 11/2018 | Lin | G06F 1/1681 |
| 2019/0041922 A1 * | 2/2019 | Kurma Raju | H05K 7/2039 |
| 2020/0204666 A1 | 6/2020 | Hong | |
| 2020/0356143 A1 * | 11/2020 | Oh | G06F 1/1616 |
| 2023/0422448 A1 * | 12/2023 | Huh | H05K 7/20481 |

FOREIGN PATENT DOCUMENTS

| | | |
|---|---|---|
| JP | 2021015522 A | 2/2021 |
| JP | 2021174913 A | 11/2021 |
| JP | 7175367 B1 | 11/2022 |

* cited by examiner

*Primary Examiner* — Allen L Parker
*Assistant Examiner* — Christopher L Augustin
(74) *Attorney, Agent, or Firm* — SHIMOKAJI IP

(57) ABSTRACT

An electronic apparatus includes a first chassis, a second chassis, a hinge device having a movable portion applied with a lubricant and connecting the first chassis and the second chassis relatively rotatably, a spine part made of a thermal conductive material, a first thermal conductive member which is provided on an inner surface of the first chassis and contacts the spine part at a position not to overlap with the movable portion at a second posture, and a second thermal conductive member which is provided on an inner surface of the second chassis and contacts the spine part at a position not to overlap with the movable portion at the second posture.

7 Claims, 8 Drawing Sheets

FOLDABLE ELECTRONIC APPARATUS

BACKGROUND OF THE INVENTION

Field of the Invention

The present invention relates to an electronic apparatus having a plurality of chassis connected by a hinge device.

Description of the Related Art

In recent years, an electronic apparatus such as a PC, a smartphone or the like which has a touch panel type liquid crystal display and does not have a physical keyboard is rapidly spreading. The display of this type of electronic apparatus is desired to be large when in use, but it is desired to be able to be made smaller when not in use. Therefore, there has been proposed an electronic apparatus in which chassis are configured so as to be foldable therebetween by using a flexible display such as an organic EL (Electro Luminescence) (refer to, for example, Japanese Unexamined Patent Application Publication No. 2021-015522).

SUMMARY OF THE INVENTION

As the electronic apparatus described above, there is, for example, a configuration in which a motherboard or the like on which a CPU and the like are mounted is loaded on one chassis, and a battery device and the like are loaded on the other chassis.

In such a configuration, the amount of heat generated in the chassis on the side of the motherboard on which a processing device such as a CPU is mounted becomes significantly larger than the amount of heat generated in the chassis on the side of the battery device, and a temperature difference may occur between the chassis. However, it may be difficult to load a cooling device having a high cooling capacity in the chassis of the electronic apparatus as described above due to the influence of its miniaturization and thinning. As a result, in the electronic apparatus, there is concern that the performance of the CPU or the like may be degraded, or a localized high temperature portion (hot spot) may occur on the outer surface of the chassis on the board side.

On the other hand, such a structure for adjusting a temperature balance between the chassis should not affect the appearance quality of the electronic apparatus.

The present invention has been made in view of the problems of the above related arts. An object of the present invention is to provide an electronic apparatus capable of adjusting a temperature balance between chassis while suppressing the deterioration of appearance quality.

An electronic apparatus according to the first aspect of the present invention includes a first chassis configured to be loaded with a first electronic part, a second chassis configured to be adjacent to the first chassis and be loaded with a second electronic part, a hinge device configured to have a movable portion applied with a lubricant and connect the first chassis and the second chassis relatively rotatably between a first posture of stacking the first chassis and the second chassis to overlap each other in a surface normal direction and a second posture of arranging the first chassis and the second chassis in a direction perpendicular to the surface normal direction relative to each other, a spine part made of a thermal conductive material arranged to extend along a first end of the first chassis adjacent to the second chassis and a second end of the second chassis adjacent to the first chassis, cover a gap formed between the first end and the second end at the first posture, and straddle the first end and the second end at the second posture, a first thermal conductive member provided on an inner surface of the first chassis and configured to contact the spine part at a position not to overlap with the movable portion at the second posture, and a second thermal conductive member provided on an inner surface of the second chassis and configured to contact the spine part at a position not to overlap with the movable portion at the second posture.

According to the above-described aspect of present invention, it is possible to adjust a temperature balance between chassis while suppressing the deterioration of appearance quality.

DETAILED DESCRIPTION OF THE INVENTION

An electronic apparatus according to the present invention will hereinafter be described in detail by a preferred embodiment with reference to the accompanying drawings.

Figure 1:
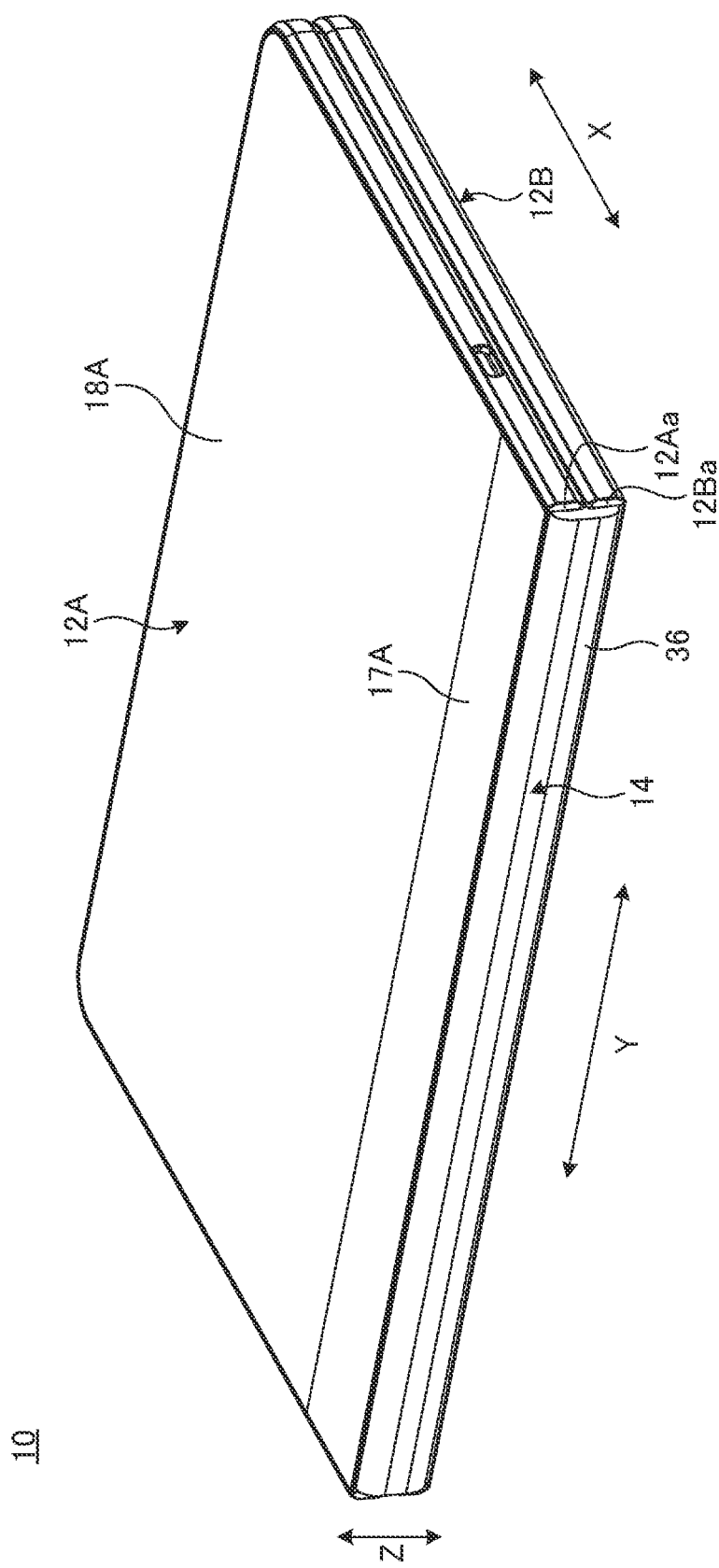
FIG. 1 is a perspective view illustrating a state in which an electronic apparatus according to an embodiment is closed to assume a 0-degree posture.
Figure 2:
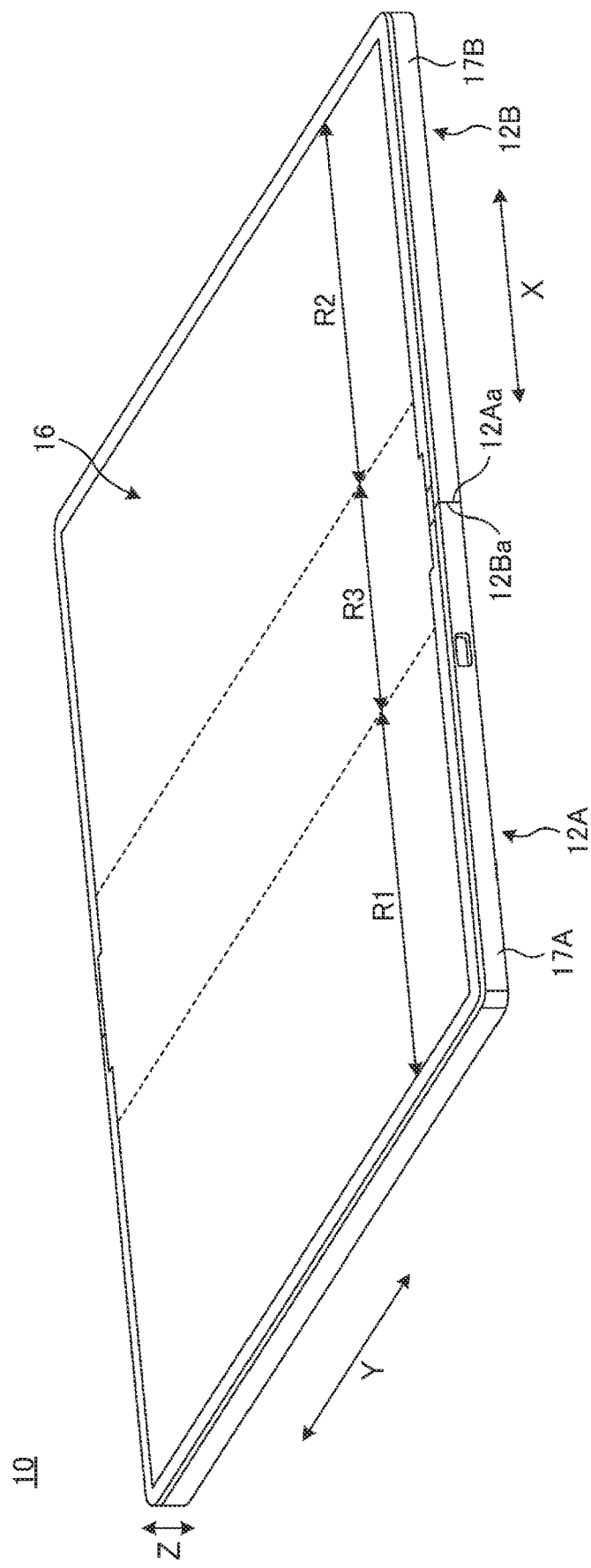
FIG. 2 is a plan view schematically illustrating a state in which the electronic apparatus illustrated in FIG. 1 is opened to assume a 180-degree posture.
Figure 3:
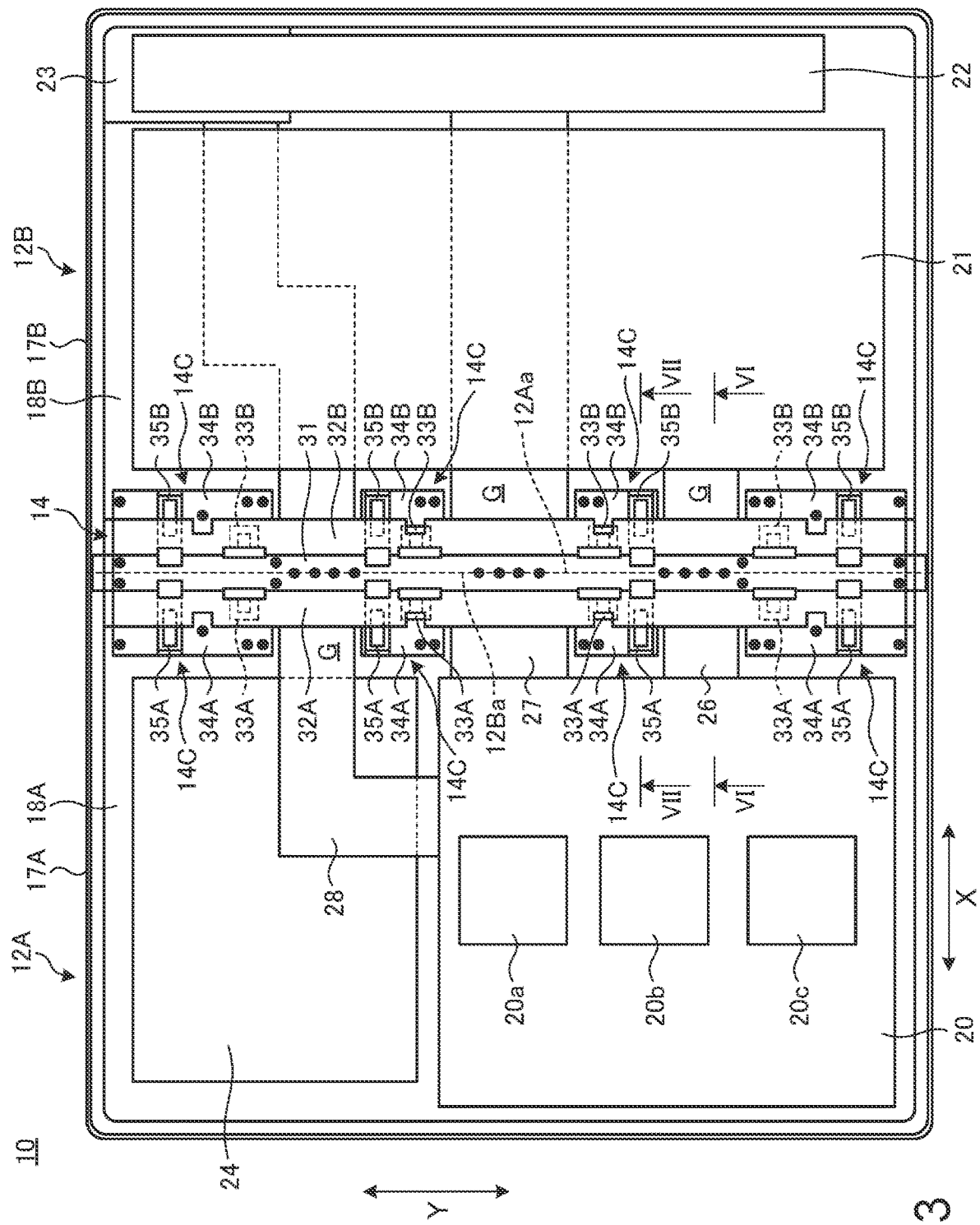
FIG. 3 is a plan view schematically illustrating an internal structure of the electronic apparatus illustrated in FIG. 2.

FIG. 1 is a perspective view illustrating a state in which an electronic apparatus 10 according to an embodiment is closed to assume a 0-degree posture. FIG. 2 is a plan view schematically illustrating a state in which the electronic apparatus 10 illustrated in FIG. 1 is opened to assume a 180-degree posture. FIG. 3 is a plan view schematically illustrating an internal structure of the electronic apparatus 10 illustrated in FIG. 2.

As illustrated in FIGS. 1 to 3, the electronic apparatus 10 includes a first chassis 12A, a second chassis 12B, a hinge device 14, and a display 16. The display 16 extends over between the chassis 12A and 12B. In the present embodiment, the electronic apparatus 10 used as a tablet PC or a laptop PC foldable like a book is exemplified. The electronic apparatus 10 may be a smartphone or a portable game machine or the like.

The chassis 12A and 12B are arranged adjacent to each other. The first chassis 12A includes a frame member 17A and a cover member 18A. The frame member 17A is a rectangular frame-shaped member with vertical walls formed on three sides other than a first end 12Aa adjacent to the second chassis 12B. The cover member 18A is a plateshaped member which closes the back opening of the frame member 17A (refer also to FIG. 6). Likewise, the second chassis 12B includes a frame member 17B with vertical walls formed on three sides other than a second end 12Ba adjacent to the first chassis 12A, and a cover member 18B which closes the back opening of the frame member 17B. The surface openings of the frame members 17A and 17B are closed with the display 16.

Each of the members 17A, 17B, 18A, and 18B is constituted of a metal member such as stainless steel, magnesium, aluminum, or the like, or a fiber-reinforced plastic board containing a reinforcing fiber such as a carbon fiber, or the like.

The hinge device 14 connects the chassis 12A and 12B so that they can rotate relative to each other between the 0-degree posture and the 180-degree posture. The hinge device 14 also functions as a spine cover which hides a gap between the ends 12Aa and 12Ba formed in the 0-degree posture illustrated in FIG. 1.

In the electronic apparatus 10, the direction in which the chassis 12A and 12B are arranged, the direction along the ends 12Aa and 12Ba perpendicular to it, and the thickness direction of the chassis 12A and 12B will hereinafter be referred to as an X direction, a Y direction, and a Z direction for explanation, respectively. Further, in terms of the angle posture between the chassis 12A and 12B, a state in which they are stacked so as to overlap each other in a surface normal direction, and a state in which they are arranged in a direction (X direction) perpendicular to the surface normal direction each other will be referred to as the 0-degree posture (refer to FIG. 1) and the 180-degree posture (refer to FIGS. 2 to 4) for explanation, respectively. The postures between 0 degrees and 180 degrees can be taken by carving the angle appropriately. For example, a state in which the surface normal directions of the chassis 12A and 12B are perpendicular to each other assumes a 90-degree posture. These angles are for convenience of explanation. In an actual product, the angular position may naturally deviate slightly from the exact angular position indicated by the angular number.

As illustrated in FIG. 3, the first chassis 12A is loaded with a motherboard 20. The motherboard 20 is mounted with electronic parts such as a CPU (Central Processing Unit) 20a, a communication module 20b, an SSD (Solid State Drive) 20c, etc. The CPU 20a is a processing device which performs calculations related to the main control and processing of the electronic apparatus 10. The CPU 20a is the largest heat generating body among the electronic parts loaded in the electronic apparatus 10. The communication module 20b performs information processing of wireless communications which are transmitted and received via an antenna loaded in the second chassis 12B, for example. The communication module 20b corresponds to, for example, a wireless WAN or a fifth generation mobile communication system. The SSD 20c is a storage device using a semiconductor memory. The first chassis 12A is loaded with various electronic parts even in addition to the motherboard 20. The communication module 20b and the SSD 20c are heat generating bodies each having an amount of heat generation next to the CPU 20a.

The second chassis 12B is loaded with a battery device 21, a display board 22, and a sub card 23. The battery device 21 is a secondary battery which serves as a main power supply for the electronic apparatus 10. Incidentally, the first chassis 12A is loaded with a battery device 24 which serves as a sub power supply. The display board 22 is a control board for the display 16. The sub card 23 is a board mounted with, for example, a power supply button, an external connector based on the USB (Universal Serial Bus) standard, etc. The second chassis 12B is loaded with various electronic parts even in addition to the battery device 21 and the like.

The battery device 21, the display board 22, and the sub card 23 are respectively connected to the motherboard 20 by using flexible boards 26, 27, and 28 straddling the ends 12Aa and 12Ba. However, the amount of heat generated by the battery device 21, the display board 22, and the sub card 23 is smaller than that of the CPU 20a or the like. Therefore, in the electronic apparatus 10, the amount of heat generated in the first chassis 12A is larger than the amount of heat generated in the second chassis 12B.

Figure 4:
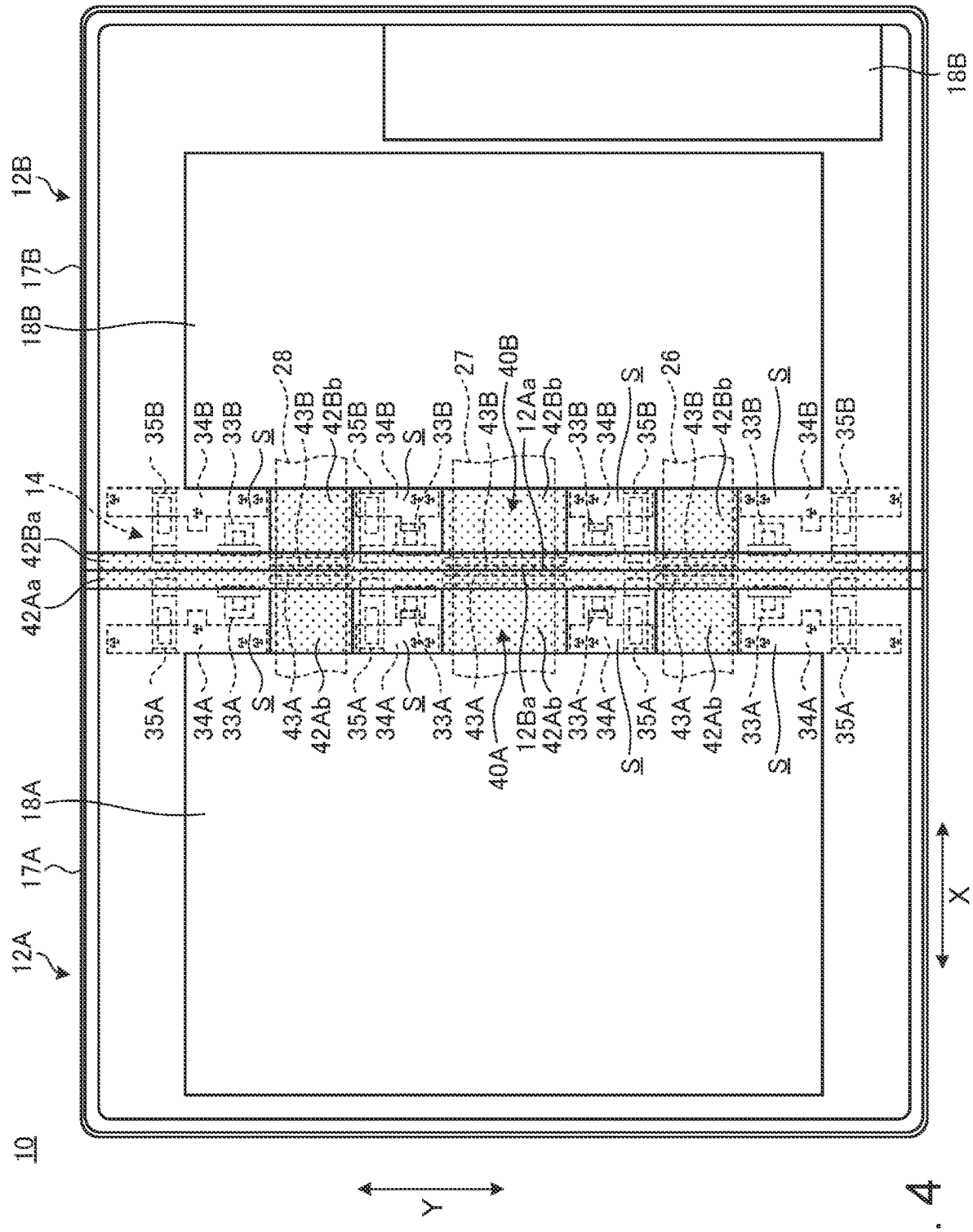
FIG. 4 is a plan view schematically illustrating a state in which electronic parts such as a hinge device, a motherboard, and a battery device are removed from the electronic apparatus illustrating in FIG. 3.
Figure 5:
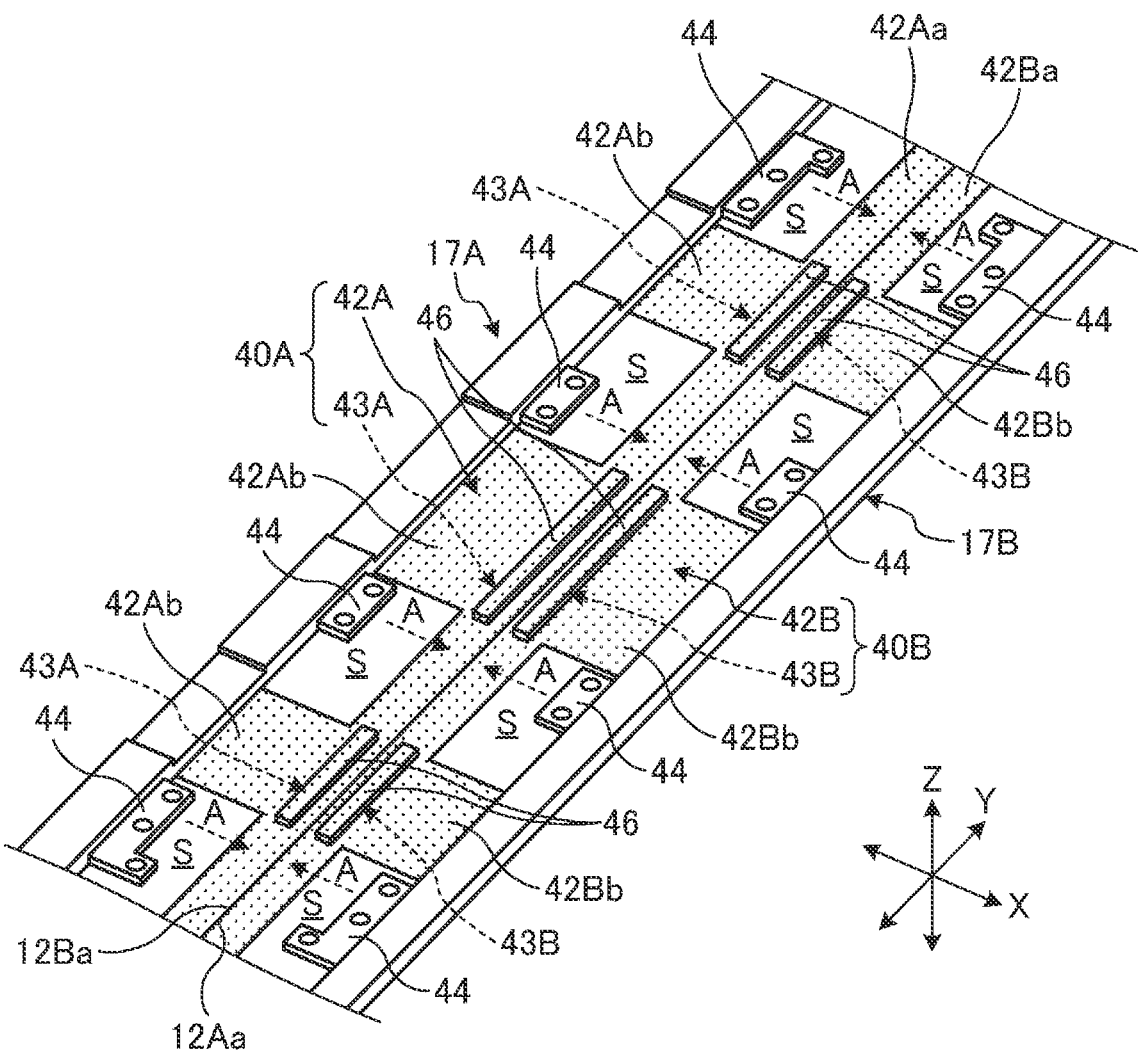
FIG. 5 is an enlarged perspective view of an end between chassis and peripheral portions thereof illustrated in FIG. 4.
Figure 6:
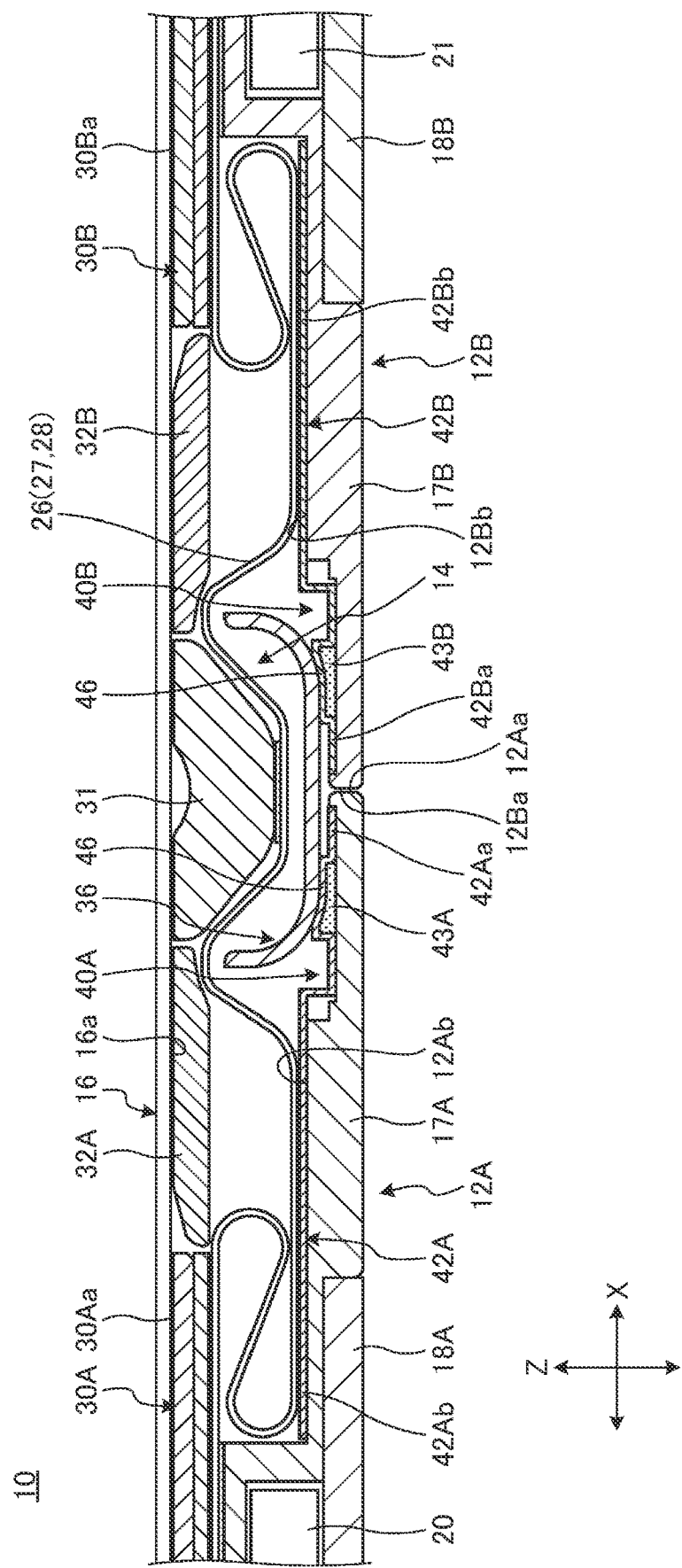
FIG. 6 is a schematic sectional view taken along line VI-VI in FIG. 3.
Figure 7:
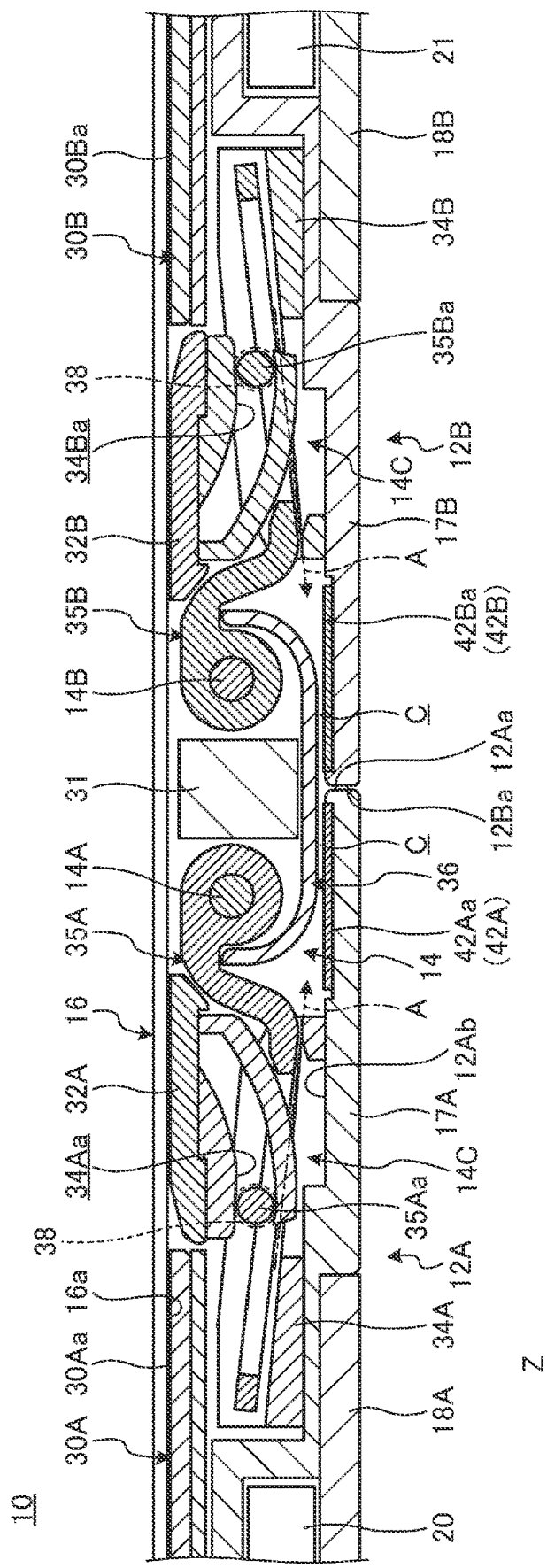
FIG. 7 is a schematic sectional view taken along line VII-VII in FIG. 3.
Figure 8:
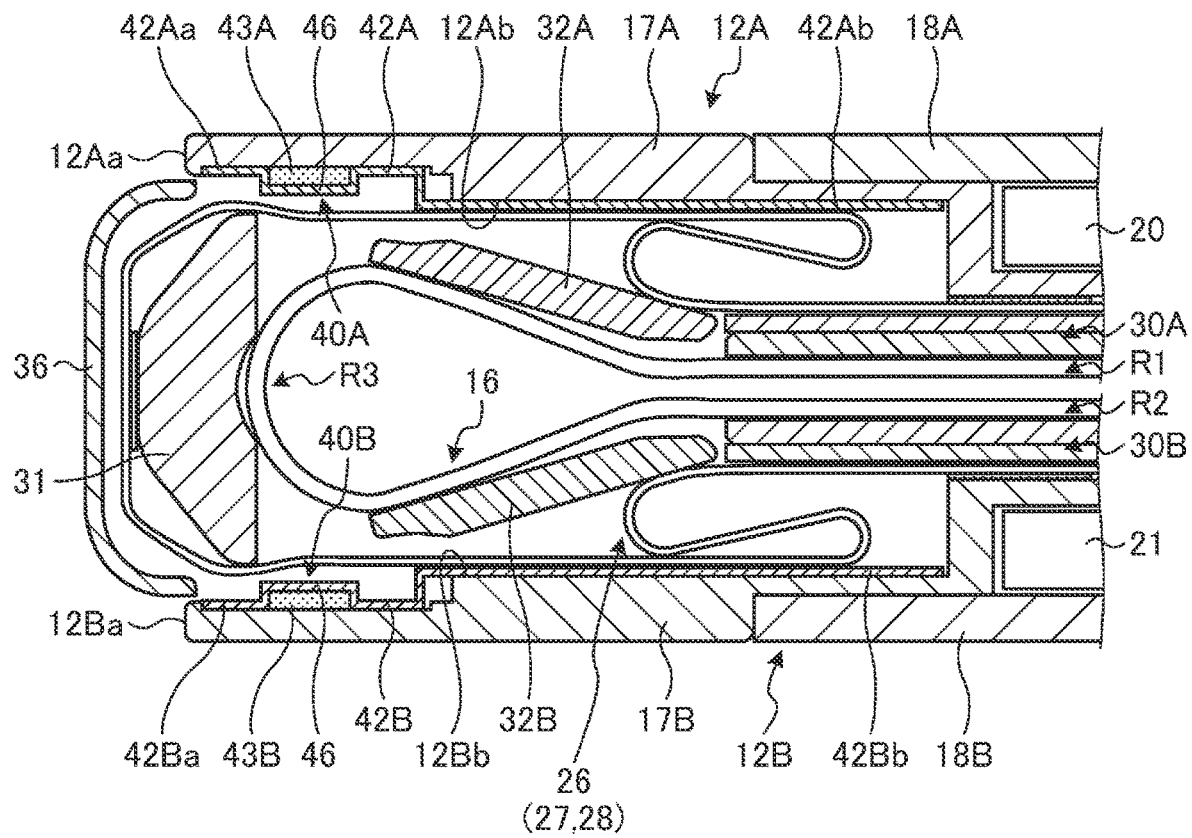
FIG. 8 is a schematic sectional view illustrating the state in which the electronic apparatus illustrated in FIG. 6 assumes the 0-degree posture.

FIG. 4 is a plan view schematically illustrating a state in which the electronic parts such as the hinge device 14, the motherboard 20, and the battery devices 21 and 24, etc. are removed from the electronic apparatus 10 illustrating in FIG. 3. FIG. 5 is an enlarged perspective view of the ends 12Aa and 12Ba between the chassis 12A and 12B illustrated in FIG. 4 and their peripheral portions. FIG. 6 is a schematic sectional view taken along line VI-VI in FIG. 3. FIG. 7 is a schematic sectional view taken along line VII-VII in FIG. 3. FIG. 8 is a schematic sectional view illustrating a state in which the electronic apparatus 10 illustrated in FIG. 6 assumes the 0-degree posture.

In the 0-degree posture illustrated in FIGS. 1 and 8, the chassis 12A and 12B become a state of being folded in two. The display 16 is a paper-like flexible display formed of an organic EL. At the 0-degree posture, the display 16 becomes a state in which a region R1 on the first chassis 12A side illustrated in FIG. 2 and a region R2 on the second chassis 12B side are arranged opposite to each other, and a folding region R3 being a boundary region between the regions R1 and R2 is folded in a circular-arc shape. At the 180-degree posture illustrated in FIG. 2, the chassis 12A and 12B are arranged side by side in the left-right direction with each other. At this time, the display 16 has the regions R1 and R2 and the folding region R3 arranged side by side on an XY plane and assumes a flat plate shape as a whole (refer to FIG. 6).

In the display 16, the region R1 is fixed relatively to the first chassis 12A, and the region R2 is fixed relatively to the second chassis 12B. Specifically, as illustrated in FIG. 6, a back surface 16a of the region R1 is fixed to the first chassis 12A via a first plate 30A, and a back surface 16a of the region R2 is fixed to the second chassis 12B via a second plate 30B.

As illustrated in FIGS. 6 and 7, the plates 30A and 30B are arranged to the left and right with the hinge device 14 sandwiched therebetween and support the display 16 on their respective surfaces 30Aa and 30Ba. At the back surface 16a of the display 16, the region R1 is adhesively fixed to the surface 30Aa of the first plate 30A, and the region R2 is adhesively fixed to the surface 30Ba of the second plate 30B. Each of the plates 30A and 30B is configured to have, for example, a carbon fiber reinforced resin board in which a matrix resin such as an epoxy resin is impregnated into a carbon fiber, and a metal frame made from a magnesium alloy, which surrounds the outer periphery of the back surface of the carbon fiber reinforced resin board.

The folding region R3 of the display 16 is relatively movable to the chassis 12A and 12B. At the 180-degree posture, a back surface 16a of the folding region R3 is supported by the hinge device 14 (refer to FIG. 6). At the 0-degree posture, the folding region R3 is folded in a circular-arc shape, a part of the back surface 16a is supported by the hinge device 14, and the most part thereof is separated from the hinge device 14 (refer to FIG. 8).

As illustrated in FIG. 3 and FIGS. 6 to 8, the hinge device 14 in the present embodiment has a hinge main body 31, a first support plate 32A, and a second support plate 32B.

The hinge main body 31 is provided at a position where it straddles the ends 12Aa and 12Ba of the chassis 12A and 12B and extends over substantially the entire length in the Y-direction along the ends 12Aa and 12Ba. The hinge main body 31 is a block-shaped part formed of a metal material such as aluminum. Two hinge shafts 14A and 14B arranged in the X direction in the 180-degree posture are supported by the hinge main body 31 (refer to FIG. 7).

As illustrated in FIG. 3, a first end of a first link arm 33A is supported on the first hinge shaft 14A so as to be rotatable around the shaft. A second end of the first link arm 33A is connected to a first bracket 34A so as to be relatively rotatable using a rotating shaft. Further, a first end of a first support arm 35A is supported on the first hinge shaft 14A so as to be rotatable around the shaft (refer to FIG. 7). A second end of the first support arm 35A is connected to the first bracket 34A so as to be relatively rotatable using a rotating shaft. The first support arm 35A is aligned with the first link arm 33A in the Y direction. The first bracket 34A is fixed to an inner surface 12Ab of the first chassis 12A with screws or the like.

A first end of a second link arm 33B is supported on the second hinge shaft 14B so as to be rotatable around the shaft. A second end of the second link arm 33B is connected to a second bracket 34B so as to be relatively rotatable using a rotating shaft. Further, a first end of a second support arm 35B is supported on the second hinge shaft 14B so as to be rotatable around the shaft (refer to FIG. 7). A second end of the second support arm 35B is connected to the second bracket 34B so as to be relatively rotatable using a rotating shaft. The second support arm 35B is aligned with the second link arm 33B in the Y direction. The second bracket 34B is fixed to an inner surface 12Bb of the second chassis 12B with screws or the like.

As illustrated in FIG. 3, the hinge device 14 has a plurality of movable portions 14C in each of which one first link arm 33A and one first support arm 35A are connected to one first bracket 34A. The movable portions 14C are arranged in a plural number with a gap G between each other along the Y direction which is the longitudinal direction of the hinge main body 31. That is, the movable portions 14C are intermittently connected along the longitudinal direction of the hinge main body 31. The second bracket 34B, the first link arm 33A, and the first support arm 35A also configure a similar movable portion 14C. Thus, the hinge main body 31 connects relatively rotatably between the chassis 12A and 12B. The hinge main body 31 is also provided therewithin with a gear mechanism of synchronizing rotating motion between the chassis 12A and 12B, a torque mechanism of applying predetermined rotating torque to the rotating motion between the chassis 12A and 12B, etc.

In the movable portions 14C, the link arms 33A and 33B and the support arms 35A and 35B rotate or slide with respect to the brackets 34A and 34B respectively. Thus, the movable portion 14C is applied with lubricant 38 such as grease because the metal parts slide against each other (refer to FIG. 7). In the present embodiment, as illustrated in FIG. 7, particularly, the support arms 35A and 35B are rotated while metal shafts 35Aa and 35Ba are sliding within slider grooves 34Aa and 34Ba formed in the brackets 34A and 34B. Therefore, the lubricant 38 becomes essential for sliding portions between the metal shafts 35Aa and 35Ba and the slider grooves 34Aa and 34Ba.

As illustrated in FIGS. 1 and 6, a spine part 36 is mounted onto the outer surface of the hinge main body 31. The spine part 36 is a substantially U-shaped plate corresponding to the outer surface shape of the hinge main body 31. The spine part 36 is formed of, for example, a thermal conductive material such as an aluminum alloy, stainless steel, or the like. The spine part 36 is a decorative cover for improving the quality of the outer surface. The flexible boards 26 to 28 pass between the hinge main body 31 and the spine part 36 at the position to straddle the ends 12Aa and 12Ba.

At the 180-degree posture illustrated in FIGS. 6 and 7, the hinge main body 31 straddles in the X direction, the ends 12Aa and 12Ba accommodated in the chassis 12A and 12B and adjacent to each other. At the 0-degree posture illustrated in FIG. 8, the hinge main body 31 is arranged to block a gap formed between the ends 12Aa and 12Ba largely spaced from each other. At this time, the spine part 36 is arranged on the outermost surface to prevent degradation in the appearance design of the folded electronic apparatus 10 (refer to FIG. 1).

That is, at postures of angles other than 180 degrees (for example, 0-degree posture or 90-degree posture), the spine part 36 covers the gap formed between the chassis 12A and 12B (refer to FIGS. 1 and 8). Thus, the spine part 36 prevents internal parts of the chassis 12A and 12B from being exposed to the outside from the gap. The spine part 36 is arranged to straddle in the X direction, the ends 12Aa and 12Ba in close proximity to each other at the 180-degree posture and is accommodated in the chassis 12A and 12B (refer to FIG. 6).

For example, when the hinge main body 31 is comprised of one or more small piece parts instead of the configuration in which the hinge main body 31 extends in the Y direction as illustrated in FIG. 3, the spine part 36 may be supported by the chassis 12A and 12B separately from the hinge device 14. That is, the spine part 36 does not necessarily have to be a constituent element of the hinge device 14. In short, as long as it can cover the gap between the ends 12Aa and 12Ba in the postures of the angles other than 180 degrees, there are no restrictions on its configuration or mounting mode. However, in the present embodiment, since the spine part 36 is the component for the hinge device 14, a separate configuration or mechanism for attaching the spine part 36 to the chassis 12A and 12B is not required, and the configuration can be simplified.

Next, the support plates 32A and 32B are plates each formed of a metal material such as aluminum and are symmetrical in shape. The support plates 32A and 32B are provided on the sides of the inner surfaces 12Ab and 12Bb of the chassis 12A and 12B and extend over substantially the entire length in the Y direction along the ends 12Aa and 12Ba.

The first support plate 32A is arranged between the first plate 30A and the hinge main body 31. In the first support plate 32A, an edge portion thereof on the first plate 30A side is connected to the first bracket 34A so as to be relatively rotatable via the rotating shaft. In the first support plate 32A, an edge portion thereof on the hinge main body 31 side is relatively movable to the hinge main body 31. Since the second support plate 32B is symmetrical with respect to the first support plate 32A, a detailed description of the configuration and mounting structure of the second support plate 32B, etc. will be omitted.

The support plates 32A and 32B respectively swing in accordance with the rotating motion of the chassis 12A and 12B. At the 180-degree posture, the support plates 32A and 32B support the back surface 16a of the folding region R3 of the display 16 on their surfaces. In the posture of the angles other than 180 degrees, each of the support plates 32A and 32B comes into contact with the display 16 in a state in which a gap is provided therebetween, or with a slight force of such a degree that it does not deform the display 16 (refer to FIG. 8). The support plates 32A and 32B may be configured to support the folding region R3 of the display 16 even in the posture of the angles other than 180 degrees and correct the shape thereof. Thus, while the support plates 32A and 32B support the folding region R3 of the display 16 stably on the plane at the 180-degree posture, they do not hinder a folding motion of the folding region R3.

Incidentally, in the electronic apparatus 10 according to the present embodiment, as described above, the amount of heat generated in the first chassis 12A loaded with the motherboard 20 is larger than the amount of heat generated in the second chassis 12B loaded with the battery device 21 and the like. Thus, the electronic apparatus 10 has first and second thermal conductive members 40A and 40B as a configuration for promoting heat transfer between the left and right chassis 12A and 12B and equalizing the heat of the chassis 12A and 12B.

As illustrated in FIGS. 4 to 8, the first thermal conductive member 40A is provided in the first chassis 12A and has a first thermal conductive sheet 42A and a first cushion member 43A. The second thermal conductive member 40B is provided in the second chassis 12B and has a second thermal conductive sheet 42B and a second cushion member 43B. The first and second thermal conductive members 40A and 40B are arranged in substantially bilateral symmetry.

The first and second thermal conductive sheets 42A and 42B are sheet-like members each formed of a thermal conductive material such as a graphite sheet, a copper sheet or an aluminum sheet. The graphite sheet is used for the first and second thermal conductive sheets 42A and 42B in the present embodiment. The graphite sheet is made by processing graphite (black lead) being an allotrope of carbon into a sheet and has high thermal conductivity. Each of the first and second thermal conductive sheets 42A and 42B is a sheet which has a thickness of about 10 μm to 1 mm, for example and is thin and flexible. The first and second thermal conductive sheets 42A and 42B are adhesively secured to the inner surfaces 12Ab and 12Bb of the chassis 12A and 12B. The first and second thermal conductive sheets 42A and 42B in FIGS. 4 and 5 are demonstrated with dot patterns.

As illustrated in FIGS. 4 and 5, the first thermal conductive sheet 42A has a first sheet 42Aa extending in the Y direction and a second sheet 42Ab extending in the X direction so as to be perpendicular to the first sheet 42Aa.

The first sheet 42Aa is provided in a strip-like region along the first end 12Aa, of the inner surface 12Ab of the first chassis 12A and overlaps with the hinge main body 31 in the Z direction.

The second sheet 42Ab is provided in the gap G between the movable portions 14C and 14C of the hinge device 14, of the inner surface 12Ab of the first chassis 12A. In the present embodiment, the second sheets 42Ab are arranged in the three gaps G respectively, and there are provided three in total. The second sheet 42Ab is placed at a position where it does not overlap with the first bracket 34A which constitutes the movable portion 14C. That is, the second sheet 42Ab is provided at a position in the inner surface 12Ab avoiding a space S where the first bracket 34A is attached (refer to FIG. 5). Reference numeral 44 in FIG. 5 is a mounting base for screwing each of the brackets 34A and 34B, which is arranged in the space S.

Incidentally, the flexible boards 26 to 28 are not capable of being allowed to pass through the movable portion 14C, it is necessary to allow them to pass through the ends 12Aa and 12Ba in avoidance of it. Therefore, the flexible boards 26 to 28 respectively pass the three gaps G so as to avoid the spaces S and naturally overlap with the second sheet 42Ab in the Z direction (refer to FIGS. 4 and 6).

As illustrated in FIGS. 4 and 5, the second thermal conductive sheet 42B has a first sheet 42Ba which extends in the Y direction and is provided in a strip-like region along the second end 12Ba, and a second sheet 42Bb which extends in the X direction so as to be perpendicular to the first sheet 42Ba. Since the second thermal conductive sheet 42B may have a bilaterally symmetrical structure with respect to the first thermal conductive sheet 42A, a detailed description thereof will be omitted.

The first and second cushion members 43A and 43B are formed of a material having flexibility and a certain degree of repulsive force like rubber, sponge, etc. The first and second cushion members 43A and 43B in the present embodiment are a sponge. The first and second cushion members 43A and 43B are larger in thickness in the Z direction than the first and second thermal conductive sheets 42A and 42B and are about 1 to 2 mm, for example.

As illustrated in FIGS. 4 to 6 and FIG. 8, each first cushion member 43A is provided between the first thermal conductive sheet 42A and the inner surface 12Ab of the first chassis 12A. Each first cushion members 43A is arranged at an intersection of the first sheet 42Aa and the second sheet 42Ab. In the present embodiment, the first cushion members 43A are respectively arranged at three intersections of the first sheet 42Aa and the three second sheets 42Ab and are provided three in total. Thus, in the first thermal conductive member 40A, a bank-like protruding portion 46 where the first thermal conductive sheet 42A rises is formed at each position where the first cushion member 43A is arranged.

The first cushion member 43A has a rectangular parallelepiped shape which is narrow in the X direction and long in the Y direction. The first cushion member 43A in the present embodiment is smaller in X-direction dimension than the first sheet 42Aa and almost the same as the second sheet 42Aa in Y-direction dimension. That is, the first thermal conductive sheet 42A has an outer shape larger than that of the first cushion member 43A when the first chassis 12A is viewed on plane.

As illustrated in FIGS. 4 to 6, the second cushion member 43B is provided between the second thermal conductive sheet 42B and the inner surface 12Bb of the second chassis 12B and formed with a protruding portion 46. Since the second cushion member 43B may have a bilaterally symmetrical structure with respect to the first cushion member 43A, a detailed description thereof will be omitted.

As illustrated in FIG. 6, the first and second cushion members 43A and 43B force the first and second thermal conductive sheets 42A and 42B against the spine part 36 at the 180-degree posture. Accordingly, the first and second thermal conductive members 40A and 40B come into contact with the spine part 36 at the portion where the protruding portion 46 is present. As illustrated in FIG. 7, the first and second thermal conductive sheets 42A and 42B are separated from the spine part 36 at the 0-degree posture.

As illustrated in FIGS. 5 and 7, each of the first and second cushion members 43A and 43B is not arranged at a position to overlap with the movable portion 14C in the Z direction. That is, the protruding portion 46 is not provided at a position to overlap with the movable portion 14C at the 180-degree posture. Therefore, even at the 180-degree posture illustrated in FIG. 7, a clearance C is formed between each of the first and second thermal conductive sheets 42A and 42B and the spine part 36 at a position where it overlaps with the movable portion 14C. Thus, the first and second thermal conductive members 40A and 40B do not contact the spine part 36 at this portion.

As described above, the electronic apparatus 10 according to the present embodiment includes the spine part 36 made of the thermal conductive material, and the hinge device 14 having the movable portion 14C applied with the lubricant 38. Further, the electronic apparatus 10 includes the first thermal conductive member 40A which is provided on the inner surface 12Ab of the first chassis 12A and comes into contact with the spine part 36 at the position where it does not overlap with the movable portion 14C at the 180-degree posture, and the second thermal conductive member 40B which is provided on the inner surface 12Bb of the second chassis 12B and comes into contact with the spine part 36 at the position where it does not overlap with the movable portion 14C at the 180-degree posture.

Thus, in the electronic apparatus 10, at the 180-degree posture, the heat generated in the first chassis 12A by the CPU 20a or the like is transferred to the first thermal conductive member 40A and the spine part 36 and further transferred to the second chassis 12B via the second thermal conductive member 40B, so that the heat is dissipated appropriately. As a result, the electronic apparatus 10 can equalize a temperature balance between the left and right chassis 12A and 12B, efficiently cool the CPU 20a, and further suppress hot spots from occurring on the back of the first chassis 12A loaded with the CPU 20a. That is, the first thermal conductive member 40A functions as a thermal transport member which transports the heat in the first chassis 12A and the heat of the first cover member 18A to the spine part 36. Further, the second thermal conductive member 40B functions as a thermal diffusion member which receives the heat transported from the first thermal conductive member 40A to the spine part 36 and dissipates the heat into the second chassis 12B and to the second cover member 18B.

Incidentally, in the electronic apparatus 10, there is a possibility that as indicated by broken-line arrows A in FIGS. 5 and 7, the lubricant 38 applied to each movable portion 14C of the hinge device 14 leaks out and adheres to the surfaces of the first and second thermal conductive sheets 42A and 42B stuck on the inner surfaces 12Ab and 12Bb of the chassis 12A and 12B. If the lubricant 38 adhered to the surfaces of the first and second thermal conductive sheets 42A and 42B adheres to the spine part 36, the lubricant 38 is exposed to the outside at the 0-degree posture illustrated in FIG. 8, which not only impairs the appearance quality, but also causes discomfort to the user when touched.

In this regard, as described above, the electronic apparatus 10 according to the present embodiment is configured so that each of the first and second thermal conductive members 40A and 40B contacts the spine part 36 at the position where it does not overlap with the movable portion 14C at the 180-degree posture (refer to FIG. 6). Specifically, the protruding portion 46 formed by each of the first and second cushion members 43A and 43B is provided only at the position where it does not overlap with the movable portion 14C. In other words, each of the first and second thermal conductive members 40A and 40B has the protruding portion 46 provided at the position where it does not overlap with the movable portion 14C in the Z direction at the 180-degree posture and overlaps with the spine part 36. Then, the protruding portion 46 comes into contact with the spine part 36.

Therefore, the electronic apparatus 10 suppresses the lubricant 38 from adhering to the spine part 36 even when as indicated by the arrows A in FIGS. 5 and 7, the lubricant 38 leaks out from the movable portion 14C and adheres to the surfaces of the first and second thermal conductive sheets 42A and 42B, more specifically, the first sheets 42Aa and 42Ba. This is because the first sheets 42Aa and 42Ba are always separated from the spine part 36 by the clearance C or more during from the 0-degree posture to the 180-degree posture. As a result, the electronic apparatus 10 does not expose the lubricant 38 to the outside at the 0-degree posture illustrated in FIG. 8 and can suppress the deterioration of appearance quality and user's discomfort.

In the electronic apparatus 10, the first and second thermal conductive sheets 42A and 42B have the outer shapes larger than those of the first and second cushion members 43A and 43B in plan view. Therefore, the first and second thermal conductive members 40A and 40B can obtain a greater thermal diffusion effect due to the first and second thermal conductive sheets 42A and 42B which have spread outside the portions where the first and second cushion members 43A and 43B brought into contact with the spine part 36 are provided.

Incidentally, the present invention is not limited to the above-described embodiment. It is needless to say that the present invention may be freely changed within the scope not departing from the spirit of the present invention.

For example, in the above, each of the first and second thermal conductive members 40A and 40B has contacted the spine part 36 at the position where it does not overlap with the movable portion 14C. However, it is not intended to exclude even a slight overlap between the protruding portion 46 and the movable portion 14C. As long as the lubricant 38 having leaked out from the movable portion 14C cannot easily reach the surface of the protruding portion 46, the slight overlap is not hindered.

The electronic apparatus 10 may separately be loaded with a cooling device for cooling the CPU 20a. As the cooling device, a heat spreader such as a copper plate, an aluminum plate, a vapor chamber or the like, and further a cooling fin or a blower fan or the like connected to these can be exemplified.

The electronic apparatus 10 foldable into two like the book has been exemplified in the above, but the present invention is applicable to various configurations such as a double-door configuration in which small chassis are foldably connected to the left and right edges of a large chassis, an S-type folding configuration in which chassis different in folding direction are respectively connected to the left and right edges of one chassis, a J-type folding configuration in which a small chassis is foldably connected to one of the left and right edges of a large chassis, etc. in addition to the configuration of folding the chassis of the same shape into two. The number of chassis connections may be four or more.

The invention claimed is:
1. An electronic apparatus comprising:
a first chassis configured to be loaded with a first electronic part;
a second chassis configured to be adjacent to the first chassis and to be loaded with a second electronic part;
a hinge device having a main body and a movable portion with a lubricant and configured to rotatably connect the first chassis and the second chassis between a first posture of the first chassis and the second chassis stacked to overlap each other in a surface normal direction and a second posture of the first chassis and the second chassis in a direction perpendicular to the surface normal direction;

a spine part made of a thermal conductive material and that extends along a first end of the first chassis and along a second end of the second chassis adjacent to the first chassis, covers a gap formed between the first end and the second end when the first and second chassis are in the first posture, straddles the first end and the second end when the first and second chassis are in the second posture, and is interposed between the main body and the first and second ends;

a first thermal conductive member on an inner surface of the first chassis and configured to contact the spine part at a position that does not overlap with the movable portion when the first and second chassis are in the second posture; and a second thermal conductive member on an inner surface of the second chassis and configured to contact the spine part at a position that does not overlap with the movable portion when the first and second chassis are in the second posture;

wherein each of the first thermal conductive member and the second thermal conductive member has a protruding portion at a position that does not overlap with the movable portion when the first and second chassis are in the second posture and does overlap with the spine part, and the protruding portion contacts the spine part.

2. The electronic apparatus according to claim 1, wherein the first thermal conductive member includes a first thermal conductive sheet and a first cushion member between the first thermal conductive sheet and the inner surface of the first chassis and is configured to press the first thermal conductive sheet against the spine part when the first and second chassis are in the second posture, and wherein the second thermal conductive member includes a second thermal conductive sheet and a second cushion member between the second thermal conductive sheet and the inner surface of the second chassis and is configured to press the second thermal conductive sheet against the spine part when the first and second chassis are in the second posture.

3. The electronic apparatus according to claim 2, wherein the first thermal conductive sheet has an outer perimeter larger than that of the first cushion member, and wherein the second thermal conductive sheet has an outer perimeter larger than that of the second cushion member.

4. The electronic apparatus according to claim 3, further including a display over and between the first chassis and the second chassis and configured to have a folding region that folds according to relative rotation of the first chassis and the second chassis, wherein the hinge main body that extends along the first end and the second end, that straddles the first end and the second end when the first and second chassis are in the second posture, and that supports a back surface of the display, wherein the movable portion is longitudinally connected to a part of the hinge main body, and wherein the first thermal conductive sheet and the second thermal conductive sheet extend along the longitudinal direction of the hinge main body.

5. The electronic apparatus according to claim 2, wherein the first thermal conductive sheet and the second thermal conductive sheet are each a graphite sheet.

6. The electronic apparatus according to claim 1, wherein each of the first thermal conductive member and the second thermal conductive member is configured to form a gap with respect to the spine part by the protruding portion at the position that does not overlap with the movable portion when the first and second chassis are in the second posture.

7. The electronic apparatus according to claim 1, further including a flexible board configured to connect the first electronic part and the second electronic part, wherein the protruding portion overlaps with the flexible board.

* * * * *